(12) United States Patent
Hoehler

(10) Patent No.: US 7,193,919 B2
(45) Date of Patent: *Mar. 20, 2007

(54) SELECTIVE BANK REFRESH

(75) Inventor: Rainer Hoehler, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/249,773

(22) Filed: Oct. 12, 2005

(65) Prior Publication Data

US 2006/0087902 A1    Apr. 27, 2006

Related U.S. Application Data

(63) Continuation of application No. 10/674,905, filed on Sep. 30, 2003, now Pat. No. 6,956,782.

(51) Int. Cl.
*G11C 7/00*    (2006.01)

(52) U.S. Cl. .................. 365/222; 365/203; 365/230.06

(58) Field of Classification Search ................ 365/222, 365/203, 230.06, 236, 230.03
See application file for complete search history.

(56) References Cited

U.S. PATENT DOCUMENTS

| | | | | |
|---|---|---|---|---|
| 5,122,988 | A  * | 6/1992 | Graeve ........................ | 365/219 |
| 6,167,484 | A  * | 12/2000 | Boyer et al. ................ | 711/106 |
| 6,721,223 | B2 * | 4/2004 | Matsumoto et al. ........ | 365/222 |
| 6,956,758 | B2 * | 10/2005 | Takatsuka et al. ........ | 365/233.5 |
| 6,956,782 | B2 * | 10/2005 | Hoehler ...................... | 365/222 |

* cited by examiner

*Primary Examiner*—Gene N. Auduong
(74) *Attorney, Agent, or Firm*—Brinks Hofer Gilson & Lione

(57) ABSTRACT

A method of refreshing several memory banks of a memory device that receives command signals from a memory controller. The method includes monitoring command signals received by a memory device and refreshing the several memory banks based on the monitored command signals so as to avoid unnecessary power consumption for refreshing particular ones of the several memory banks with irrelevant contents.

30 Claims, 3 Drawing Sheets

SELECTIVE BANK REFRESH

RELATED APPLICATIONS

The present application is a continuation of U.S. patent application Ser. No. 10/674,905, filed Sep. 30, 2003, now U.S. Pat. No. 6,956,782 which is hereby incorporated by reference.

BACKGROUND

1. Field of the Invention

The present invention relates to the field of memory systems, and in particular memory systems that employ a refresh operation.

2. Discussion of Related Art

It is well known in the art that various types of personal computers, such as desktop computers and battery-operated notebook computers, include a central processing unit (CPU) and a main memory to which the central processing unit accesses. The central processing unit executes programs loaded on the main memory, and sequentially writes the results obtained by program execution into work areas in banks of the main memory so that the computer processing is performed.

The main memory is composed of a random access memory (RAM), such as SRAM (static RAM) and DRAM (dynamic RAM). For the main memory, DRAM is generally used because DRAM has a simple cell structure and is cheaper. Accordingly, the discussion to follow will concentrate on known DRAM memory systems.

DRAM memory cells in the main memory are arranged as a matrix. In order to address memory cells individually, first, an Activate Command is issued with a row address, and then, read or write commands are issued with the column address. In the DRAM memory cells, data are stored as electric charges on a capacitor. Thus, when data are written to the memory cells and are left for an extended period of time, the charges leak from the capacitor and the stored data are lost. To prevent such data loss, the written data needs to be refreshed/rewritten at predetermined time intervals.

Known refresh operations include accessing a specific memory cell row to refresh all of the cells along that row. In order to refresh all of the row addresses, a refresh address counter is required that designates refresh addresses sequentially. In addition, the known refresh operations provide either a refresh cycle or issue a refresh request at a predetermined period of time.

One known method to refresh the memory contents is to serially access all rows with an activate—precharge command-sequence. For this method, a refresh address counter designates refresh row addresses that must be provided from outside the memory.

A second known refresh operation is generally known as autorefresh where a refresh request is supplied to the memory by sending an Autorefresh command. The refresh addresses are generated by an address counter within the DRAM such that no external address counter is required.

A third known refresh operation is self-refresh, which allows the data in the DRAM to be refreshed even while the rest of the system is powered down. During self-refresh an internal timing circuit and an internal address counter generate the refresh operations for all rows in time intervals sufficiently short to keep the stored data intact. This allows for very low power consumption since the time-intervals between refreshes can be optimized and all other circuits can be powered down.

FIG. 1 is a schematic diagram illustrating the arrangement of a known computer system 100 that has both the normal refresh function and the self-refresh function. A DRAM device 102, including a DRAM array_103, and a memory controller unit 104 are connected to each other by a bus 106 and an I/O device 108. Outside the DRAM device 102 are provided a normal refresh circuit 110, which forms a part of the memory controller unit 104 that performs a refresh operation while the memory controller unit 104 is accessing the memory, and a global clock 112. Inside the DRAM device 102 are provided a self-refresh circuit 114 that performs a relatively slow refresh operation, and an internal timing generator 116 that supplies a relatively long interval signal to the self-refresh circuit 114. In addition, a switch 118 is provided to select either the normal refresh circuit 110 or the self-refresh circuit 114 for refreshing the DRAM device 102.

Should the switch 118 select the self-refresh circuit 114, then as previously described the known method of self-refresh is used to refresh all banks within the DRAM array 103 at the same time or to program externally which banks or parts of banks are refreshed. This can lead to situations where banks are refreshed which do not need to be refreshed since their contents are irrelevant. This is assumed to be the case if data has never been written into a bank. Due to the fact that each refresh sequence of activating and precharging a row-address costs energy, such unnecessary refresh operations cause unnecessary power consumption.

BRIEF SUMMARY

A first aspect of the present invention regards a memory control system which includes a memory controller and a memory device connected to the memory controller via a command bus, wherein command signals are directed from the memory controller to the memory device. The memory device includes several memory banks, a bank refresh indicator register, and a command decoder that is connected to the bank refresh indicator and receives the command signals and controls the contents of the bank refresh indicator register. A refresh circuit connected to the several memory banks and the bank refresh indicator register, wherein the refresh circuit avoids unnecessary power consumption for refreshing particular ones of the several memory banks with irrelevant contents.

A second aspect of the present invention regards a method of refreshing several memory banks of a memory device that receives command signals from a memory controller. The method includes monitoring command signals received by the memory device and refreshing the several memory banks based on the monitored command signals so as to avoid unnecessary power consumption for refreshing particular ones of the several memory banks with irrelevant contents.

The above aspect of the present invention provides the advantage of reducing power during self-refreshing of a memory system.

The present invention, together with attendant objects and advantages, will be best understood with reference to the detailed description below in connection with the attached drawings.

DETAILED DESCRIPTION OF THE DRAWINGS AND THE PRESENTLY PREFERRED EMBODIMENTS

Figure 1:
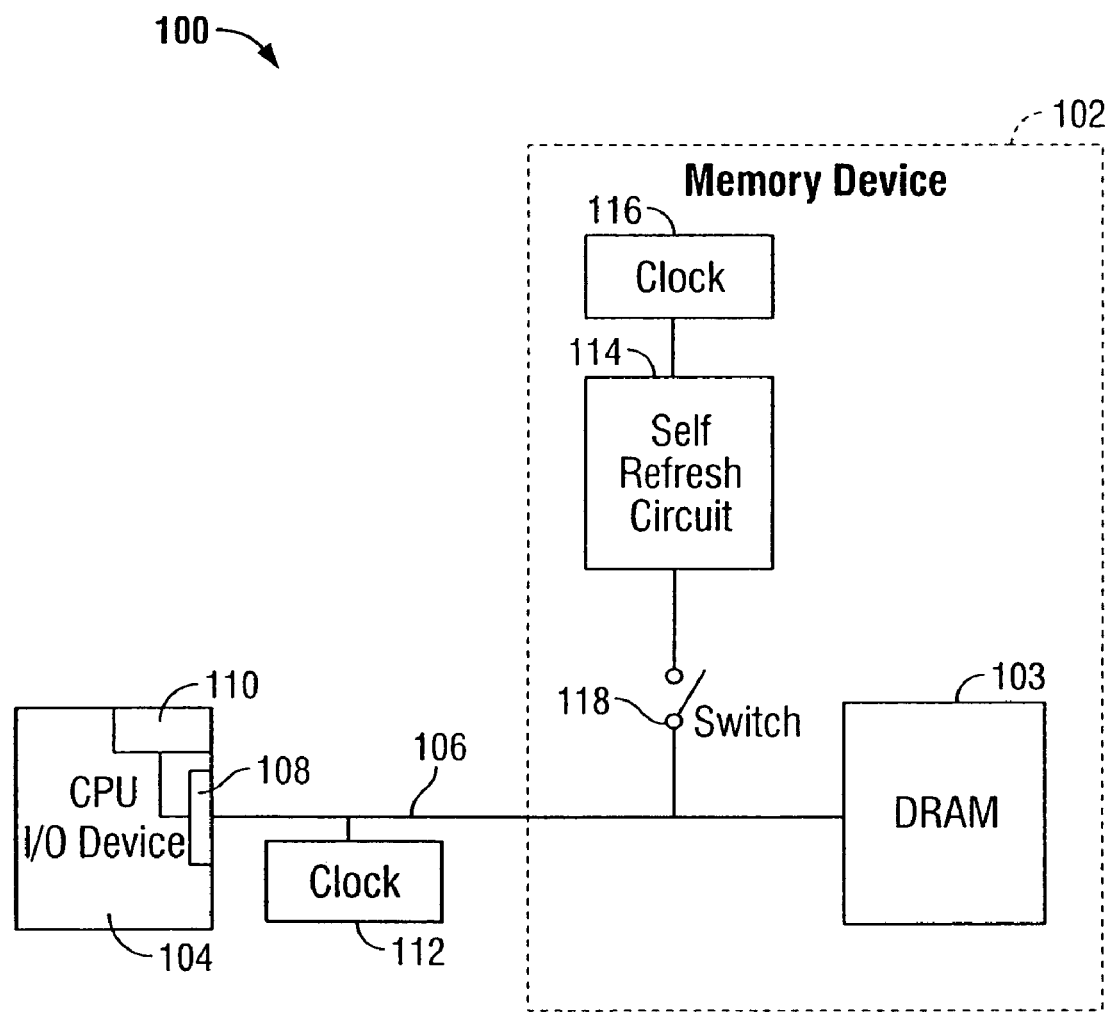
FIG. 1 schematically shows an embodiment of a known memory device that includes normal and self-refresh circuits.
Figure 2:
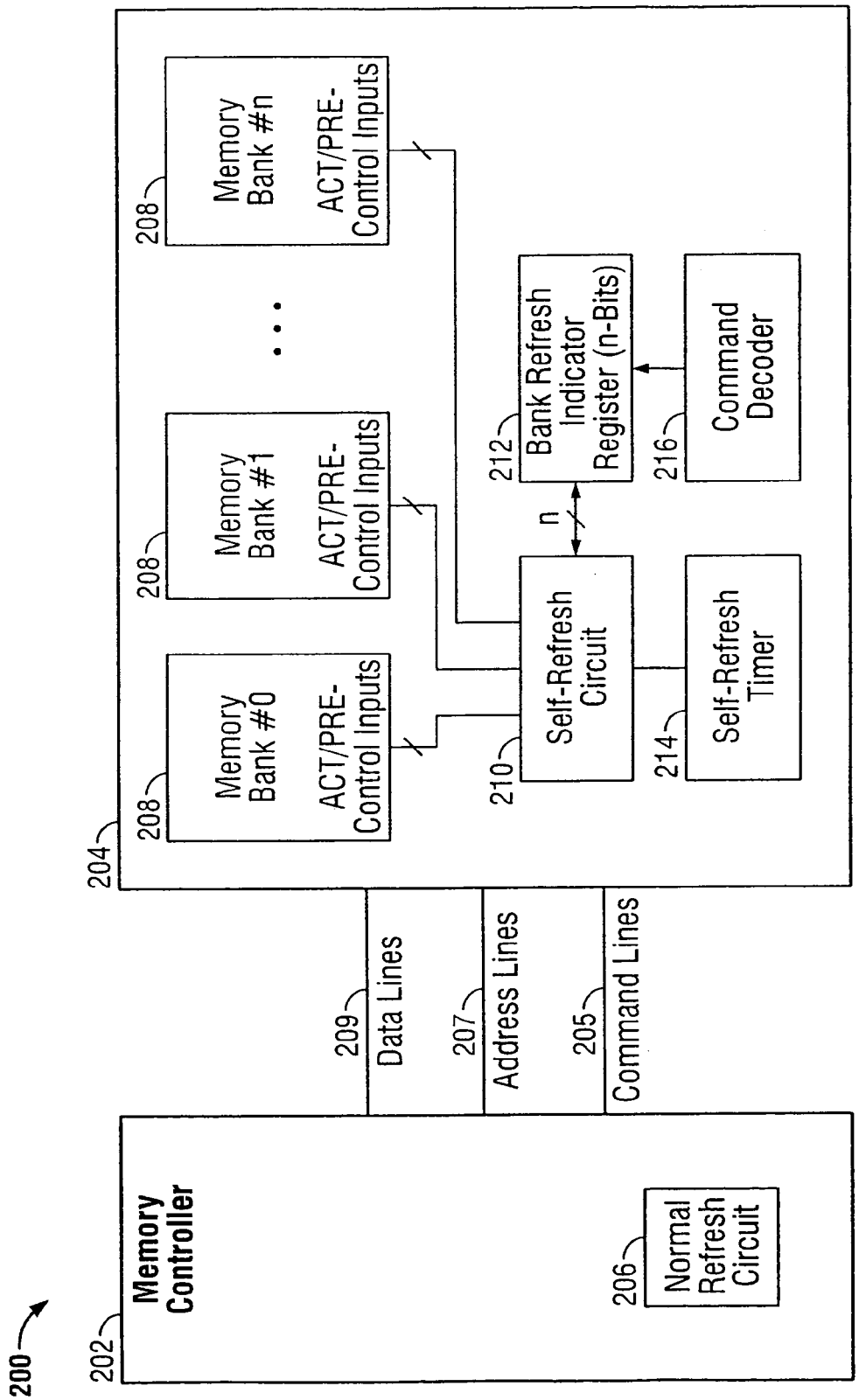
FIG. 2 schematically shows a first embodiment of a memory system in accordance with the present invention.
Figure 3:
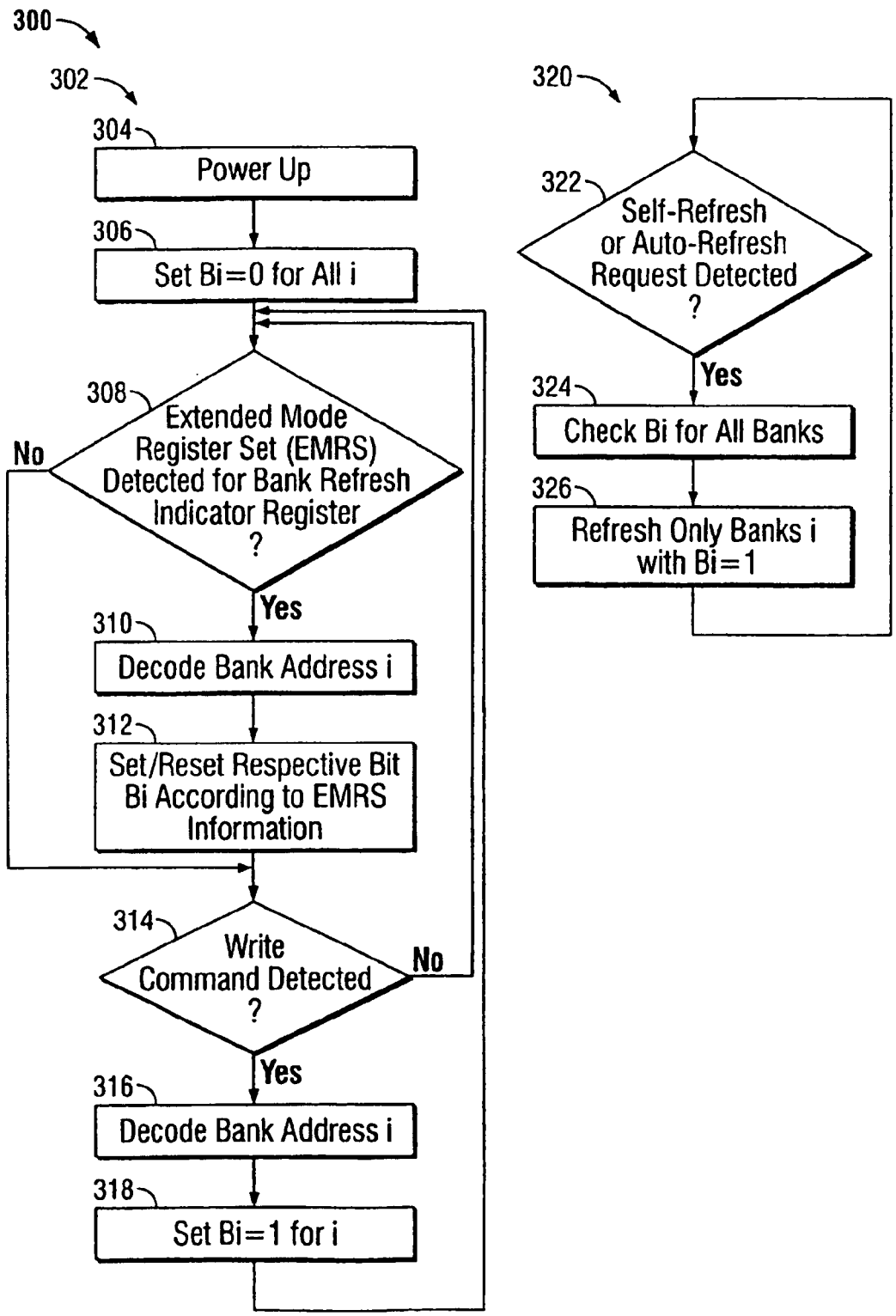
FIG. 3 shows a flow chart of an embodiment of a refresh process in accordance with the present invention to be used with the memory system of FIG. 2.

The present invention is best understood by a review of the embodiments and modes of operation represented by FIGS. 2 and 3. As shown in FIG. 2, a memory system 200 includes a memory controller 202 and a memory device 204. The memory controller 202 executes memory accesses (including both read accesses and write accesses) of the memory device 204 in response to memory access requests issued by a central processing unit (not illustrated).

The memory controller 202 and the memory device 204 are connected together by a command bus 205 of command signals, an address bus 207 of address signals, and a data bus 209 of data signals, clock signals (not illustrated) and datastrobe signals (not illustrated).

The memory controller 202 has a normal refresh circuit 206 that performs a normal refresh operation in a manner similar to that described previously. The normal refresh circuit 206 provides a normal refresh cycle every predetermined interval, by sending an autorefresh signal to the memory device 204 through the command bus 205.

Incorporated in the memory device 204 are a self-refresh circuit 210, a self-refresh timer 214, a command decoder 216, and a bank refresh indicator register 212. The self-refresh circuit 210 includes a refresh address counter for incrementing a row address to be refreshed at each refresh cycle, and a controller for, in response to a refresh request, controlling access to a row address such that all rows get refreshed within a given time period to avoid loss of memory contents. The address counter covers all row-addresses and restarts at the lowest row address after the highest row-address has been refreshed. The incorporated refresh circuit 210 executes either a "normal refresh" operation and a "self-refresh" operation upon receipt of a corresponding refresh request. A normal refresh operation is realized by responding to a memory autorefresh refresh request from the normal refresh circuit 206, and by accessing a designated row address.

A self-refresh operation is begun when the memory device 204 is put into self-refresh mode through the respective command sequence from the memory controller 200. In the self-refresh mode, a self-refresh request is issued to the self-refresh circuit 210 from the memory controller 200 every predetermined time period that is triggered by a self-refresh timer 214. In state-of-the art memories devices, such a self-refresh circuit leads to an activate/precharge sequence for all memory banks 208 of the memory device 204 in parallel. An example of a known self-refresh circuit that can be adapted for use with the present invention is the 256 Mbit-DDR-SDRAM manufactured and sold by Infineon under the part number HYB25D25616OBT-6.

As shown in FIG. 2, the memory device 204 includes a bank refresh indicator register 212 that is in communication with both a command decoder 216 and the self-refresh circuit 210. The register 212 has one bit for each memory bank 208.

The command decoder 216 monitors all write commands directed to the memory banks 208 and controls the contents of the bank refresh indicator register 212. In the discussion to follow, the bit corresponding to the ith memory bank will be denoted by $B_i$, wherein i=0, 1, 2, . . . n. Each bit $B_i$ identifies whether or not the ith memory bank has to be refreshed during a self-refresh operation. Each bit $B_i$ can also be implemented in such a way that it identifies whether or not the ith memory bank has to be refreshed in any case of auto-refresh or self-refresh. For example, if the bit $B_i$ is in a high state, then the ith memory bank must be refreshed. If the bit $B_i$ is in a low state, then the ith memory bank does not need to be refreshed. A memory bank i is denoted as requiring refreshing whenever data have been written to this bank since power-up of the memory device or since the last reset of the respective bit $B_i$ by a special command sequence.

The contents of the bank refresh indicator register 212 are all initially set to low-level during the power-up sequence of the memory device 204. Afterwards, the contents of the bank refresh indicator register 212 are controlled by the command decoder 216 of the memory device 204. Whenever a write-command is issued to the memory device 204, the command decoder 216 decodes this write command and also decodes the bank-address to which date are written. Next, the command decoder 216 sets the respective bit $B_i$ of the addressed bank in the bank refresh indicator register 212 to a high-level. Thus, the command decoder 216 identifies which ones of the memory banks contains data. A command sequence, usually referred to as an extended mode register set can be used to program/reset single bits or all of the bits of the bank refresh indicator register 212 to a low-level. Thus, the command sequence programs the bank refresh indicator register 212 and declares the contents of the respective memory banks 208 as relevant and without necessity to be refreshed.

The self-refresh circuit 210 monitors the contents of the bank-refresh indicator register 212 and starts the activate/precharge sequence only for those banks where the respective bit $B_i$ of the bank-refresh indicator register 212 is set to the high-level. For those banks where the respective bit $B_i$ is low, the self-refresh circuit 210 suppresses the refresh of wordlines of those banks. Thus, the circuit 210 avoids unnecessary power consumption for refreshing banks which are defined to not require to be refreshed by a low-level of the respective bit $B_i$ in the bank refresh indicator register 212. The circuit 210 can be altered in such a way that it either checks the bank refresh indicator register 212 1) only in case of self-refresh mode or 2) both in self-refresh and auto-refresh mode.

As shown in FIG. 3, two parallel processes are controlling the self-refresh—and with respective implementation also autorefresh—process 300. The two processes are performed by a global control circuit that includes the command decoder 216. The sub-process 302 controls the contents of the bank refresh indicator register 212. At power-up of the memory device (step 304), all bits $B_i$ of the register get reset to low level (equal to logical 0) per step 306. Whenever a command is detected at the memory device 204 by the command decoder 216, the command is checked if it is an extended mode register set to the bank refresh indicator register 212 per step 308. If it is, then the bank-address given in the extended mode register set is decoded by the command decoder 216 per step 310 and the respective bit $B_i$ of the bank refresh indicator register 212 is set or reset per step 312 to the value as given, too, in the extended mode register set. If the command is not an extended mode register set or the bit has been set/reset per step 312, the command is checked if it is a write command per step 314. In case a write command is detected, the bank-address gets decoded per step 316 and the respective bit $B_i$ gets set to high-level (equal to logical 1) per step 318. The second parallel sub-process 320 is the refresh flow. Whenever a self-refresh or an auto-refresh is detected per step 322, the self-refresh circuit reads out the contents of the bank-refresh indicator register per step 324 prior to activating row of the banks during a refresh operation. Then, only those banks are refreshed whose respective bit $B_i$ of the bank-refresh indicator register had a low-level (equals to a logical 0) per step 326.

Based on the above description of the process 300, the design of memory controller 200 and memory device 204 based on existing DRAM products from vendors like Samsung, Micron, Elpida and Infineon is very straightforward for any DRAM designer or general logic designer.

The foregoing description is provided to illustrate the invention, and is not to be construed as a limitation. Numerous additions, substitutions and other changes can be made to the invention without departing from its scope as set forth in the appended claims.

The invention claimed is:

1. A memory device including a plurality of storage locations and requiring a refresh operation, the memory device comprising:
   a refresh indicator;
   a command decoder that is connected to the refresh indicator and controls the contents of the refresh indicator; and
   a refresh circuit connected to the plurality of storage locations and to the refresh indicator and controlling the refresh operation to avoid unnecessary power consumption for refreshing storage locations of the memory device which are defined to not require to be refreshed based on the contents of the refresh indicator.

2. A memory device including a plurality of storage locations and requiring a refresh operation, the memory device comprising:
   a refresh indicator configured to store information about which of the plurality of storage locations are to be refreshed; and
   a refresh circuit coupled with the plurality of storage locations and the refresh indicator to control the refresh operation to avoid unnecessary power consumption for refreshing storage locations of the memory device which are defined to not require to be refreshed based on the information stored in the refresh indicator.

3. The memory device of claim 2, wherein the refresh indicator comprises a read/write register storing a plurality of bits, a bit of the read/write register corresponding to a respective group of the plurality of storage locations.

4. The memory device of claim 3 wherein the refresh circuit is operative to read a value of each bit of the plurality of bits of the read/write register and perform the refresh operation only for the storage locations corresponding to a bit having a first data value.

5. The memory device of claim 4 wherein the refresh circuit is operative to read the value of each bit during a self-refresh mode of the memory device.

6. The memory device of claim 2 further comprising a decoder which decodes commands and addresses received by the memory device and sets the value of the bit dependent on the decoding.

7. A memory device comprising:
   memory banks which are independently refreshable during refresh cycles of the memory device; and
   a refresh indicator which is written with bits having a value to define which memory bank should be refreshed during each refresh cycle to avoid unnecessary power consumption for refreshing memory banks of the memory device which are defined to not require to be refreshed by the value of bits.

8. The memory device of claim 7 wherein the refresh indicator stores bits which correspond to respective memory banks, the stored bits having a first value indicating that a refresh operation should be started for the corresponding memory bank, the stored bits having a second value indicating that a refresh operation should be suppressed for the corresponding memory bank.

9. The memory device of claim 8 wherein the bits of the refresh indicator are reset to the second value upon a power-up of the memory device.

10. The memory device of claim 7 further comprising:
    a refresh circuit coupled with the memory banks and the refresh indicator to initiate the refresh cycle to the memory banks which should be refreshed based on the bits stored in the bank refresh indicator.

11. The memory device of claim 10 further comprising:
    a decoder coupled to the refresh indicator and operative to decode commands and bank-addresses received by the memory device and to set the value of the bits of the refresh indicator according to the decoding.

12. A method for operating a memory device, the method comprising:
    storing data in a plurality of storage locations;
    storing information about which of the plurality of storage locations are to be refreshed during a refresh cycle of the memory device; and
    during the refresh cycle, starting a refresh operation to selected storage locations based on the stored information to avoid unnecessary power consumption for refreshing storage locations of the memory device which are defined to not require to be refreshed by the stored information.

13. The method of claim 12 wherein storing information comprises:
    storing a plurality of bits in a register, each bit corresponding to a respective group of the plurality of storage locations.

14. The method of claim 13 wherein storing information further comprises storing each bit of the plurality of bits with a first value indicating that the corresponding storage locations are to be refreshed and storing each bit with a second value indicating that the corresponding storage locations are not to be refreshed.

15. The method of claim 12 further comprising:
    monitoring command signals received by the memory device; and
    updating the information about which storage locations are to be refreshed based on the received command signals.

16. The method of claim 15 wherein monitoring comprises determining whether or not a write command is received by the memory device and indicating that one of the plurality of storage locations contains data stored therein.

17. The method of claim 12 wherein starting a refresh operation comprises starting a self refresh operation.

18. The method of claim 12 wherein starting a refresh operation comprises starting an auto refresh operation.

19. The method of claim 12 further comprising:
    setting a bit of a refresh indicator to a value dependent on the monitoring; and
    wherein the refreshing of the storage locations is dependent on the value of the bit.

20. A method for operating a memory device, the method comprising:
storing in the memory device a plurality of bits, each bit corresponding to a memory bank of a plurality of memory banks of the memory device, each bit having a value to define whether its corresponding memory bank should be refreshed during a refresh cycle to avoid unnecessary power consumption for refreshing memory banks of the memory device which are defined to not require to be refreshed by individual bits of the plurality of bits;
during refresh cycles of the memory device, initiating a refresh of memory banks which correspond to stored bits having a refresh value; and
during the refresh cycles, suppressing a refresh of memory banks which correspond to stored bits not having the refresh value.

21. The method of claim 20 further comprising:
monitoring command signals received by a memory device; and
setting one or more bits of a bank refresh indicator to a value dependent on the monitored command signals.

22. The method of claim 21 wherein the one or more bits are reset to a low value at power-up of the memory device.

23. The method of claim 21 wherein the refresh is initiated if the value of the one or more bits is high.

24. The method of claim 21 wherein the refresh is suppressed if said value of the bit is low.

25. A memory device comprising:
a plurality of memory banks;
a bank refresh indicator register storing a plurality of bits $B_i$, each bit $B_i$ corresponding to each memory bank, each bit $B_i$ identifying whether or not the ith memory bank is to be refreshed during a refresh operation;
a command decoder coupled to the bank refresh indicator register and configured to decode commands received by the memory device and set bits of the bank refresh indicator register based on the received commands; and
a self refresh circuit coupled to the bank refresh indicator register and configured to monitor the contents of the bank refresh indicator register start a refresh operation only for those memory banks where the respective bit $B_i$ of the bank refresh indicator register is set to a high level to avoid unnecessary power consumption for refreshing storage locations of the memory device which are defined to not require to be refreshed.

26. A refresh method for a memory device, the method comprising:
initializing bits $B_i$ of a bank refresh indicator register to a reset value;
detecting commands received at the memory device;
determining if a received command is an extended mode register set to the bank refresh indicator register;
if so, decoding a bank address of the extended mode register set; and
setting or resetting a bit $B_i$ of the bank refresh indicator register based on the decoded bank address, the bits $B_i$ of the bank refresh indicator register indicating which banks are to be refreshed to avoid unnecessary power consumption for refreshing banks of the memory device which are defined to not require to be refreshed.

27. The refresh method of claim 26 further comprising:
determining if the received command is a write command;
if so, decoding a bank address of the write command; and
setting a respective bit $B_i$ of the bank refresh indicator register to a high level.

28. The refresh method of claim 26 further comprising:
when a self-refresh or auto refresh request is detected, reading contents of the bank refresh indicator register; and
refreshing only those banks whose respective bit $B_i$ of the bank refresh indicator register has a low level.

29. A memory device having a plurality of storage locations and requiring a refresh operation, the memory device comprising:
a refresh indicator storing information identifying which of the plurality of storage locations are to be refreshed during the refresh operation; and
a self refresh circuit coupled to the plurality of storage locations and to the refresh indicator and configured to initiate the refresh operation only for the storage locations where the information stored in the refresh indicator indicates that the storage locations contain data to be refreshed to avoid unnecessary power consumption for refreshing storage locations of the memory device where the stored information indicated the storage locations are not to be refreshed.

30. A memory device having a plurality of storage locations and requiring a refresh operation, the memory device comprising:
a refresh indicator storing a plurality of bits, each bit corresponding to a group of the storage locations and identifying whether or not the group of storage locations is to be refreshed during the refresh operation; and
a self refresh circuit coupled to the plurality of storage locations and to the refresh indicator and to refresh only those storage locations where the respective bit of the refresh indicator is set to a high level to avoid unnecessary power consumption for refreshing storage locations of the memory device which are defined by the bits of the refresh indicator to not require to be refreshed.

* * * * *